(12) United States Patent
Chakraborty

(10) Patent No.: US 8,188,359 B2
(45) Date of Patent: May 29, 2012

(54) THERMOELECTRIC GENERATOR ASSEMBLY FOR FIELD PROCESS DEVICES

(75) Inventor: Swapan Chakraborty, Eden Prairie, MN (US)

(73) Assignee: Rosemount Inc., Eden Prairie, MN (US)

( * ) Notice: Subject to any disclaimer, the term of this patent is extended or adjusted under 35 U.S.C. 154(b) by 733 days.

(21) Appl. No.: 11/529,767

(22) Filed: Sep. 28, 2006

(65) Prior Publication Data

US 2008/0083445 A1 Apr. 10, 2008

(51) Int. Cl.
| | |
|---|---|
| *H01L 35/00* | (2006.01) |
| *H01L 37/00* | (2006.01) |
| *H01L 35/34* | (2006.01) |
| *H01L 35/30* | (2006.01) |
| *H01L 35/28* | (2006.01) |
| *H01L 35/14* | (2006.01) |
| *H01L 35/20* | (2006.01) |
| *H01L 35/02* | (2006.01) |
| *H01L 35/16* | (2006.01) |
| *H01L 35/22* | (2006.01) |

(52) U.S. Cl. ........ 136/205; 136/200; 136/201; 136/218; 136/230; 136/238; 136/239

(58) Field of Classification Search .................. 136/205, 136/218, 238, 239, 200, 201, 230
See application file for complete search history.

(56) References Cited

U.S. PATENT DOCUMENTS

| | | | | |
|---|---|---|---|---|
| 2,883,489 | A | 4/1959 | Eadie, Jr. et al. | 335/148 |
| 3,229,759 | A | 1/1966 | Grover | 165/105 |
| 3,232,712 | A | 2/1966 | Stearns | 23/255 |
| 3,568,762 | A * | 3/1971 | Harbaugh | 165/104.26 |
| 3,612,851 | A | 10/1971 | Fowler | 362/30 |
| D225,743 | S | 1/1973 | Seltzer | D10/102 |
| 3,881,962 | A | 5/1975 | Rubinstein | 136/209 |
| 3,931,532 | A | 1/1976 | Byrd | 310/4 |

(Continued)

FOREIGN PATENT DOCUMENTS

CH 672 368 A5 11/1989

(Continued)

OTHER PUBLICATIONS

Notification of Transmittal of the International Search Report and the Written Opinion, dated Feb. 13, 2009 in connection with corresponding application number: PCT/US2007/019396.

(Continued)

*Primary Examiner* — Basia Ridley
*Assistant Examiner* — Lindsey Bernier
(74) *Attorney, Agent, or Firm* — Westman, Champlin & Kelly, P.A.

(57) ABSTRACT

A thermoelectric generator assembly includes a thermoelectric generator with hot and cold junction flanges. The hot junction flange includes an adapter shaped for thermally coupling to a process vessel. The thermoelectric generator producing a thermoelectric power output. A heat sink thermally couples to ambient air and has a heat sink flange. A heat pipe assembly includes fluid in a circulation chamber. The circulation chamber has an evaporator flange mounted to the cold junction flange and a condenser flange mounted to the heat sink flange. At least a portion of the fluid transports heat from the evaporator flange to the condenser flange. When a heat pipe assembly on a cold junction flange is used with many of the types of heat flows that are available in process industries, more efficient thermoelectric power generation can be provided in the process industries.

25 Claims, 5 Drawing Sheets

U.S. PATENT DOCUMENTS

| | | | | |
|---|---|---|---|---|
| 4,026,348 A * | 5/1977 | Roberts, Jr. | | 165/272 |
| 4,042,757 A * | 8/1977 | Jones | | 429/104 |
| 4,125,122 A * | 11/1978 | Stachurski | | 136/205 |
| 4,322,724 A | 3/1982 | Grudzinski | | 340/595 |
| 4,370,890 A | 2/1983 | Frick | | 73/18 |
| 4,383,801 A | 5/1983 | Pryor | | 416/17 |
| 4,389,895 A | 6/1983 | Rud, Jr. | | 73/724 |
| 4,476,853 A | 10/1984 | Arbogast | | 126/578 |
| 4,485,670 A | 12/1984 | Camarda et al. | | 73/179 |
| 4,520,305 A * | 5/1985 | Cauchy | | 322/2 R |
| 4,546,608 A * | 10/1985 | Shiina et al. | | 60/649 |
| 4,590,466 A | 5/1986 | Wiklund et al. | | 340/870.28 |
| 4,639,542 A * | 1/1987 | Bass et al. | | 136/210 |
| 4,651,019 A | 3/1987 | Gilbert et al. | | 307/43 |
| 4,704,607 A | 11/1987 | Teather et al. | | 340/825.07 |
| 4,749,993 A | 6/1988 | Szabo et al. | | 340/870.31 |
| 4,860,232 A | 8/1989 | Lee et al. | | 364/571.04 |
| 4,878,012 A | 10/1989 | Schulte et al. | | 324/60 |
| 4,977,480 A | 12/1990 | Nishihara | | 73/724 |
| 5,062,442 A | 11/1991 | Stenstrom et al. | | 137/110 |
| 5,094,109 A | 3/1992 | Dean et al. | | 73/718 |
| D331,370 S | 12/1992 | Williams | | D10/46 |
| D345,107 S | 3/1994 | Williams | | D10/46 |
| 5,313,831 A * | 5/1994 | Beckman | | 73/204.24 |
| 5,329,818 A | 7/1994 | Frick et al. | | 73/708 |
| 5,412,535 A | 5/1995 | Chao et al. | | 361/700 |
| 5,495,769 A | 3/1996 | Broden et al. | | 73/18 |
| 5,531,936 A | 7/1996 | Kanatzidis et al. | | 252/587 |
| 5,554,809 A | 9/1996 | Tobita et al. | | 73/700 |
| 5,606,513 A | 2/1997 | Louwagie et al. | | 702/138 |
| 5,614,128 A | 3/1997 | Kanatzidis et al. | | 252/582 |
| 5,618,471 A | 4/1997 | Kanatzidis et al. | | 252/582 |
| 5,637,802 A | 6/1997 | Frick et al. | | 73/724 |
| 5,642,301 A | 6/1997 | Warrior et al. | | 364/571.02 |
| 5,644,185 A | 7/1997 | Miller | | 310/306 |
| 5,656,782 A | 8/1997 | Powell, II et al. | | 73/756 |
| 5,665,899 A | 9/1997 | Willcox | | 731/1.63 |
| 5,682,476 A | 10/1997 | Tapperson et al. | | 395/200.05 |
| 5,705,978 A | 1/1998 | Frick et al. | | 340/511 |
| 5,722,249 A | 3/1998 | Miller, Jr. | | 62/238.2 |
| 5,793,963 A | 8/1998 | Tapperson et al. | | 395/200.31 |
| 5,803,604 A | 9/1998 | Pompei | | 374/181 |
| 5,851,083 A | 12/1998 | Palan | | 403/337 |
| 5,870,695 A | 2/1999 | Brown et al. | | 702/138 |
| 5,872,494 A | 2/1999 | Palan et al. | | 333/252 |
| 5,899,962 A | 5/1999 | Louwagie et al. | | 702/138 |
| 5,929,372 A | 7/1999 | Oudoire et al. | | 136/208 |
| 5,954,526 A | 9/1999 | Smith | | 439/136 |
| 5,978,658 A | 11/1999 | Shoji | | 455/66 |
| 6,013,204 A | 1/2000 | Kanatzidis et al. | | 252/584 |
| 6,079,276 A | 6/2000 | Frick et al. | | 73/18 |
| 6,127,739 A | 10/2000 | Appa | | 290/55 |
| 6,255,010 B1 | 7/2001 | George et al. | | 429/30 |
| 6,282,247 B1 | 8/2001 | Shen | | 375/285 |
| 6,295,875 B1 | 10/2001 | Frick et al. | | 73/718 |
| 6,312,617 B1 | 11/2001 | Kanatzidis et al. | | 363/62.3 |
| 6,338,283 B1 | 1/2002 | Blazquez Navarro | | 73/865.8 |
| 6,360,277 B1 | 3/2002 | Ruckley et al. | | 709/250 |
| 6,385,972 B1 | 5/2002 | Fellows | | 60/517 |
| 6,405,139 B1 | 6/2002 | Kicinski et al. | | 702/33 |
| 6,480,699 B1 | 11/2002 | Lovoi | | 455/41.2 |
| 6,508,131 B2 | 1/2003 | Frick | | 73/756 |
| 6,510,740 B1 | 1/2003 | Behm et al. | | 73/700 |
| 6,574,515 B1 | 6/2003 | Kirkpatrick et al. | | 700/19 |
| 6,667,594 B2 | 12/2003 | Chian | | 318/696 |
| 6,711,446 B2 | 3/2004 | Kirkpatrick et al. | | 700/19 |
| 6,747,572 B2 | 6/2004 | Bocko et al. | | 340/870.16 |
| 6,747,573 B1 | 6/2004 | Gerlach et al. | | 340/870.13 |
| 6,778,100 B2 | 8/2004 | Schempf | | 340/870.07 |
| 6,792,259 B1 | 9/2004 | Parise | | 455/343.1 |
| 6,838,859 B2 | 1/2005 | Shah | | 322/38 |
| 6,839,546 B2 | 1/2005 | Hedtke | | 455/67.11 |
| 6,843,110 B2 | 1/2005 | Deane et al. | | 73/114.35 |
| 6,891,477 B2 | 5/2005 | Aronstam | | 340/606 |
| 6,904,295 B2 | 6/2005 | Yang | | 455/522 |
| 6,907,383 B2 | 6/2005 | Eryurek et al. | | 702/183 |
| 6,910,332 B2 | 6/2005 | Fellows | | 60/520 |
| 6,942,728 B2 | 9/2005 | Caillat et al. | | 117/3 |
| 6,981,380 B2 | 1/2006 | Chrysler et al. | | 62/3.2 |
| 6,995,677 B2 | 2/2006 | Aronstam et al. | | 340/606 |
| 7,010,294 B1 | 3/2006 | Pyotsia et al. | | 455/420 |
| 7,036,983 B2 | 5/2006 | Green et al. | | 374/179 |
| 7,197,953 B2 | 4/2007 | Olin | | 73/866.5 |
| 7,301,454 B2 | 11/2007 | Seyfang et al. | | 340/539.26 |
| 7,329,959 B2 | 2/2008 | Kim et al. | | 290/2 |
| 2001/0025349 A1 | 9/2001 | Sharood et al. | | 713/340 |
| 2002/0029130 A1 | 3/2002 | Eryurek et al. | | 702/183 |
| 2002/0065631 A1 | 5/2002 | Loechner | | 702/188 |
| 2002/0148236 A1 | 10/2002 | Bell | | 62/3.3 |
| 2003/0000681 A1* | 1/2003 | Reisfeld | | 165/104.26 |
| 2003/0043052 A1 | 3/2003 | Tapperson et al. | | 340/825.37 |
| 2003/0079553 A1 | 5/2003 | Cain et al. | | 73/861.27 |
| 2003/0143958 A1 | 7/2003 | Elias et al. | | 455/73 |
| 2003/0171827 A1 | 9/2003 | Keyes, IV et al. | | 700/19 |
| 2004/0033704 A1 | 2/2004 | Selli et al. | | 439/8 |
| 2004/0142733 A1 | 7/2004 | Parise | | 455/572 |
| 2004/0159235 A1 | 8/2004 | Marganski et al. | | 95/116 |
| 2004/0199681 A1 | 10/2004 | Hedtke | | 710/37 |
| 2004/0200519 A1 | 10/2004 | Sterzel et al. | | 35/30 |
| 2004/0203434 A1 | 10/2004 | Karschnia et al. | | 455/67.11 |
| 2004/0214543 A1 | 10/2004 | Osone et al. | | 455/197.2 |
| 2004/0242169 A1 | 12/2004 | Albsmeier et al. | | 455/91 |
| 2005/0023858 A1 | 2/2005 | Bingle et al. | | 296/76 |
| 2005/0029236 A1 | 2/2005 | Gambino et al. | | 219/121.69 |
| 2005/0046595 A1 | 3/2005 | Blyth | | 340/908 |
| 2005/0076944 A1 | 4/2005 | Kanatzidis et al. | | 136/239 |
| 2005/0078451 A1 | 4/2005 | Sauciuc et al. | | 361/700 |
| 2005/0082368 A1 | 4/2005 | Watanabe | | 235/451 |
| 2005/0115601 A1 | 6/2005 | Olsen et al. | | 136/212 |
| 2005/0118468 A1 | 6/2005 | Adams et al. | | 429/22 |
| 2005/0130605 A1 | 6/2005 | Karschnia et al. | | 455/90.3 |
| 2005/0139250 A1* | 6/2005 | DeSteese et al. | | 136/212 |
| 2005/0150535 A1 | 7/2005 | Samavedam et al. | | 136/201 |
| 2005/0182501 A1 | 8/2005 | Franchuk et al. | | 700/81 |
| 2005/0201349 A1 | 9/2005 | Budampati | | 370/342 |
| 2005/0208908 A1* | 9/2005 | Karschnia et al. | | 455/127.1 |
| 2005/0222698 A1 | 10/2005 | Eryurek et al. | | 700/90 |
| 2005/0245291 A1 | 11/2005 | Brown et al. | | 455/572 |
| 2005/0281215 A1 | 12/2005 | Budampati et al. | | 370/328 |
| 2005/0289276 A1 | 12/2005 | Karschnia et al. | | 710/305 |
| 2006/0002368 A1 | 1/2006 | Budampati et al. | | 370/351 |
| 2006/0036404 A1 | 2/2006 | Wiklund et al. | | 702/183 |
| 2006/0060236 A1 | 3/2006 | Kim | | 136/203 |
| 2006/0063522 A1 | 3/2006 | McFarland | | 455/423 |
| 2006/0077917 A1 | 4/2006 | Brahmajosyula et al. | | 370/310 |
| 2006/0092039 A1 | 5/2006 | Saito et al. | | 340/825.37 |
| 2006/0148410 A1 | 7/2006 | Nelson et al. | | 455/67.11 |
| 2006/0227729 A1 | 10/2006 | Budampati et al. | | 370/278 |
| 2006/0266404 A1 | 11/2006 | Hiller et al. | | 136/205 |
| 2006/0274644 A1 | 12/2006 | Budampati et al. | | 370/216 |
| 2006/0274671 A1 | 12/2006 | Budampati et al. | | 370/254 |
| 2006/0287001 A1 | 12/2006 | Budampati et al. | | 455/552.1 |
| 2007/0006528 A1 | 1/2007 | Diebold et al. | | 48/197 R |
| 2007/0030816 A1 | 2/2007 | Kolavennu | | 370/252 |
| 2007/0030832 A1 | 2/2007 | Gonia et al. | | 370/338 |
| 2007/0054630 A1 | 3/2007 | Scheible et al. | | 455/90.3 |
| 2007/0275755 A1 | 11/2007 | Chae et al. | | 455/557 |
| 2008/0010600 A1 | 1/2008 | Katano | | 715/748 |
| 2008/0083446 A1 | 4/2008 | Chakraborty et al. | | 136/205 |
| 2008/0141769 A1 | 6/2008 | Schmidt et al. | | 73/204.19 |

FOREIGN PATENT DOCUMENTS

| | | |
|---|---|---|
| DE | 33 40 834 A1 | 5/1985 |
| DE | 3340834 A1 | 5/1985 |
| DE | 196 08 310 | 7/1997 |
| DE | 19608310 | 7/1997 |
| DE | 201 07 112 U1 | 7/2001 |
| DE | 201 07 112 U1 | 8/2001 |
| DE | 20107112 | 8/2001 |
| DE | 101 04 582 A1 | 10/2001 |
| DE | 101 28 447 | 1/2003 |
| DE | 10128447 | 1/2003 |
| EP | 0 524 550 A1 | 7/1992 |
| EP | 0 524 550 A1 | 1/1993 |
| EP | 1 293 853 | 9/2001 |
| EP | 1 202 145 | 5/2002 |
| EP | 1 293 853 | 3/2003 |

| | | |
|---|---|---|
| EP | 1 482 568 A2 | 12/2004 |
| GB | 1 397 435 A | 6/1975 |
| GB | 2 145 876 | 3/1985 |
| GB | 2 145 876 A | 4/1985 |
| GB | 2145876 A | 4/1985 |
| GB | 2293446 A * | 3/1996 |
| GB | 2310498 | 8/1997 |
| GB | 2 320 733 A | 7/1998 |
| JP | 51-110983 | 9/1976 |
| JP | 59-075684 | 4/1984 |
| JP | 59-158345 | 10/1984 |
| JP | 60-125181 | 7/1985 |
| JP | 61-154087 | 7/1986 |
| JP | 02 067794 | 3/1990 |
| JP | 2067794 | 3/1990 |
| JP | 06 199284 A | 7/1994 |
| JP | 11-036981 | 2/1999 |
| JP | 11-87786 | 3/1999 |
| JP | 11121816 (A) | 4/1999 |
| JP | 11-215867 | 8/1999 |
| JP | 2000171181 (A) | 6/2000 |
| JP | 2000/321361 | 11/2000 |
| JP | 2000-321361 | 11/2000 |
| JP | 2001-222787 | 8/2001 |
| JP | 2001/222787 | 8/2001 |
| JP | 2001-263649 | 9/2001 |
| JP | 2001-349763 | 12/2001 |
| JP | 2002/048618 | 2/2002 |
| JP | 2002-048618 | 2/2002 |
| JP | 2002-369554 | 12/2002 |
| JP | 2002369554 | 12/2002 |
| JP | 2003051894 | 2/2003 |
| JP | 2003-110156 | 4/2003 |
| JP | 2003-113850 | 4/2003 |
| JP | 2003/113850 | 4/2003 |
| JP | 2003134261 | 5/2003 |
| JP | 2003/168182 | 6/2003 |
| JP | 2003-168182 | 6/2003 |
| JP | 2004021877 | 1/2004 |
| JP | 2004-129442 | 4/2004 |
| JP | 2004208476 | 7/2004 |
| JP | 2004-296961 | 10/2004 |
| JP | 2004-349651 | 12/2004 |
| JP | 2005-72080 | 3/2005 |
| JP | 2006-214350 | 8/2006 |
| RU | 2 131 934 C1 | 6/1999 |
| RU | 2168062 C1 | 5/2001 |
| WO | WO 88/05964 | 8/1988 |
| WO | WO 91/11029 | 7/1991 |
| WO | WO 95/07522 | 3/1995 |
| WO | WO 99/53286 | 10/1999 |
| WO | WO 03/023536 | 3/2003 |
| WO | WO 2003/023536 | 3/2003 |
| WO | WO 03/089881 | 10/2003 |
| WO | WO 2004/059139 | 7/2004 |
| WO | WO 2004/082051 | 9/2004 |
| WO | WO 2004/094892 | 11/2004 |
| WO | WO 2005/086331 | 9/2005 |
| WO | WO 2006109362 | 10/2006 |
| WO | WO 2005/060482 | 7/2007 |

OTHER PUBLICATIONS

First Examination Report for Indian Application No. 3589/CHENP/2006, dated Apr. 17, 2009.
Second Office Action from Chinese Patent Application No. 200580006438.X, dated Apr. 10, 2009.
EP Communication from related application European Patent Application No. 07837769.4-1235, dated Jul. 14, 2009.
Decision on refusal to grant a patent for invention for Russian patent application No. 2006145434, filed May 5, 2005.
"Notification of Transmittal of the International Search Report and the Written Opinion", PCT/US2007/019636, dated Oct. 1, 2008.
"Invitation to Pay Additional Fees and Partial Search Report", PCT/US2007/019396, dated Oct. 7, 2008.
"Every little helps," *Economist*, p. 78, vol. 278, No. 8469, ISSN 0013-0613, Mar. 18, 2006.
"Heat pipe-Wikipedia, the free encylopedia", http://en.wikipedia.org/wiki/Heat_pipe, 3 pages, Mar. 31, 2006.
"Thermal Design and Heat Sink Manufacturing & Testing—Total Thermal and Heat Sink . . . ", http://www.enertron-inc.com/enertron-products/integrated-heat-sink.php, 2 pages, Mar. 31, 2006.
Official Office Action from the Russian Patent Office for Application No. 2006134646/06.
International Search Report and Written Opinion in Application No. PCT/US2006/035728, filed Sep. 13, 2006.
International Search Report and Written Opinion of Application No. PCT/US2005/015848, file May 5, 2005.
International Search Report and Written Opinion in Appln No: PCT/US2005/021757, filed Jun. 21, 2005.
Notification of Transmittal of the International Search Report or the Declaration—PCT/US03/10403.
"Wireless R&D Aims to Boost Traffic", by M. Moore, *InTech with Industrial Computing*, Feb. 2002, 3 pgs.
"System Checks Faraway Machines' Health", by J. Strothman, *InTech with Industrial Computing*, Feb. 2002, 1 pg.
"Wireless Management Toolkit XYR 5000", by Honeywell International Inc., Phoenix, Arizona, 3 pgs., Oct. 2003.
"Wireless Analog Input Transmitters XYR 5000", by Honeywell International Inc., Phoenix, Arizona, 4 pgs., Oct. 2003.
"Quad Analog Output Module Installation and User's Manual", by Honeywell International Inc., Phoenix, Arizona, pp. Ii, iii, iv and 1-12, Dec. 2003.
"Wireless Dual Analog Input Interface Transmitter Installation and User's Manual", by Honeywell International Inc., Phoenix, Arizona, pp. Ii-vi and 7-43, Dec. 2003.
"XYR 5000 Wireless Dual Analog Input Interface, Model Selection Guide", by Honeywell International Inc., Phoenix, Arizona, Dec. 2003.
"Wireless Measure, Monitor & Control", by Accutech, 4 pgs. May 2003.
"Wireless Instrumentation, Multi-Input Field Unit", by Accutech, 2 pgs., Dec. 2003.
"Quad Analog Output Module", by Accutech, 1 pg. Dec. 2003.
3 Pages from Website www.chemicalprocessing.com, Apr. 2004.
4 Pages from Website http://content.honeywell.com/imc/eznews/eznews0403/news.htm, 2004.
First Office Action of Chinese patent application 200580006438.X, filed Mar. 2, 2005.
Examiner's consultation for European patent application 05 724 190.3, filed Mar. 2, 2005.
Examination Report of the European Patent Office in counterpart foreign application No. 05724190.3 filed Mar. 2, 2005.
Second Office Action from Chinese patent application No. 200580014212.4, filed May 2005.
USA & Metric Thread Standards http://www.carrlane.com/Catalog/index.cfm/29425071FOB221118070C1C513906103E05543B0B05543B0B012009083C3B285357474A2D020609090C0015312A36515F5545B.
Official Action in Application No. 2006145434/09, filed May 5, 2005.
Official Communication in Application No. 05746241.8, filed May 5, 2005.
EP Communication from related application European Patent Application No. 07837963.3-1235, dated Sep. 4, 2009.
Second Official Action from Russian patent application No. 2008116682, filed Sep. 13, 2006.
Third Office Action from Chinese patent application No. 200580006438.X, dated Sep. 18, 2009.
English translation of Official Office Action from Russian patent application 2006134646/06, dated Mar. 17, 2008.
Notification of Transmittal of the International Search Report and the Written Opinion in related application PCT/US2007/019396, dated Feb. 13, 2009.
Communication from Chinese Patent Application No. 200580006438.X, dated Sep. 18, 2009.
Communication from Chinese Patent Application No. 200580006438.X, dated Apr. 10, 2009.
Notification of Transmittal of International Search Report and the Written Opinion in connection with PCT/US2005/006596, dated Sep. 6, 2005.

Communication from European Patent Application 05724190.3, dated Aug. 1, 2007.
Communication from Indian Patent Application No. 3589/CHENP/2006, dated Apr. 17, 2009.
Office Action from Chinese patent application 200780032788.8, dated Mar. 12, 2010.
Communication from European Patent Application No. 07837963.3, dated Sep. 4, 2009.
Communication from European Patent Office dated Mar. 2, 2010 for European application No. 06 803 540.1.
Foundation Fieldbus Power Supply, A Look at Powering Fieldbus, www.analogservices.com/fbsupp2.pdf, Oct. 22, 2000.
Fourth Office Action from Chinese application No. 2005/80006438.X dated May 17, 2010.
Translation of the Notice of Opposition for European Patent No. 1721067 dated Sep. 13, 2010.
Office Action for Japanese patent application No. 2007-501903, dated Jan. 20, 2010.
Notice of Opposition for European patent No. 1721067 dated Sep. 13, 2010.
Translation of DE20107112, "Mechanism to Supply Energy to Field Devices", date Apr. 20, 2001, 10 pages.
Translation of DE10128447, date Jan. 2003; 8 pages.
Second Office Action from related Chinese application No. 200780035788.8 date Sep. 10, 2010, 5 pages.
Rejection Notice for related Japanese patent application No. 2007-501903, dated Oct. 27, 2010, 2 pages.
Japanese Office Action (with English translation) from corresponding Application Serial No. JP 2009-530353, dated Nov. 1, 2011, 10 pgs.
First Chinese Office Action (with English translation) for Chinese Application No. 200780035775.0, dated Oct. 25, 2011, 29 pgs.
The Rejection Decision for related Chinese patent application No. 200780035788.8, dated Jun. 21. 2011, 7 pages.
Japanese Office Action for corresponding Japanese Patent Application No. 2009-530357, dated Dec. 20, 2011, 9 pages.

* cited by examiner

THERMOELECTRIC GENERATOR ASSEMBLY FOR FIELD PROCESS DEVICES

CROSS-REFERENCE TO RELATED APPLICATION

Reference is made to co-pending application Ser. No. 11/070,860, filed Mar. 2, 2005, titled "PROCESS DEVICE WITH IMPROVED POWER GENERATION," the content of which is hereby incorporated by reference in its entirety; and reference is also made to related co-pending U.S. patent application Ser. No. 11/529,780 entitled "PIPELINE THERMOELECTRIC GENERATOR ASSEMBLY," filed Sep. 28, 2006, the contents of which are hereby incorporated by reference in their entirety.

BACKGROUND OF THE INVENTION

Field instruments are typically widely distributed throughout a process plant and are connected by process control loops to a control system. Field instruments typically require a supply of electrical power for operation. The electrical power can be provided by the control loops themselves or by separate power wiring to the instruments. The amount of power required by each field instrument is usually quite small, and is typically on the order of about 50 milliwatts or less.

When wiring is used for control loops, the wiring is typically enclosed in electrical wiring conduits which require mechanical mounting for support on the framework of process equipment over long distances. Often, the cost of wiring a field instrument over long distances exceeds the cost of the field instrument itself.

When a wireless communication loop is used to communicate with a field instrument, the wireless communication loop does not provide a power supply to the field instrument, and separate power supply wiring is needed.

While the power required for a typical field instrument is extremely low, field instruments are often located in very hot, dangerous or inaccessible locations in the process plant. In such locations, it may be impractical to use a chemical battery as a source of low power in a field instrument. The environments in such locations are often dirty or shielded from sunlight, making use of solar cells for power supply impractical. Solar cells and batteries, in the plant environment, require too much maintenance to be usable for power supply in many field instrument applications.

Process equipment in plants typically include boilers, steam piping, heated tanks, hot oil and gas pipelines, refrigerated liquids (e.g., liquid nitrogen, liquid helium, etc.) and other equipment that are heated or cooled to a temperature that is different than ambient air temperature in the process plant. Large temperature differentials are present, and waste heat flows between the ambient air and the process equipment. The amount of energy lost due to a waste heat flow often greatly exceeds the amount of electrical power required by a field instrument.

The power and voltage of thermoelectric generators are generally directly proportional to the temperature difference or temperature gradient between hot and cold plates of a thermoelectric generator. The use of heat flows in conjunction with a thermocouples to provide power is known, for example from German Gebrauchsmusterschrift DE 201 07 112 U1 and U.S. Pat. No. 6,891,477 B2. However, there are a number of practical problems that arise.

SUMMARY OF THE INVENTION

A thermoelectric generator assembly includes a thermoelectric generator. The thermoelectric generator has spaced-apart hot and cold junction flanges. The hot junction flange has an adapter shaped for thermally coupling to a process vessel. The thermoelectric generator produces a thermoelectric power output for use in powering a process device. In one example construction, the thermoelectric generator assembly includes a heat sink. The heat sink thermally couples to ambient air and has a heat sink flange. In another example construction, the thermoelectric generator assembly includes a heat pipe assembly. The heat pipe assembly comprises a fluid in a circulation chamber. The circulation chamber has an evaporator flange mounted to the cold junction flange. The circulation chamber has a condenser flange mounted to the heat sink flange. At least a portion of the fluid transports heat from the evaporator flange to the condenser flange. In embodiments where a heat pipe assembly on a cold junction flange is used with many of the types of heat flows that are available in process industries, more efficient thermoelectric power generation can be provided in the process industries.

DETAILED DESCRIPTION OF ILLUSTRATIVE EMBODIMENTS

In the embodiments described below, a thermoelectric generator has a hot junction flange, or a hot junction flange adapter, that is shaped to couple to a heated process vessel such as a pipeline or a tank. The shaping of the hot junction flange provides good thermal conductance between the hot junction and the process vessel. The thermoelectric generator has a cold junction flange that is coupled to an evaporator flange of a heat pipe. A condenser flange of the heat pipe is coupled to a heat sink. The use of the heat pipe reduces the temperature of the cold junction flange, which provides an increased temperature differential between the hot junction flange and the cold junction flange. The increased temperature differential increases the voltage at a thermoelectric power output to more than 5 volts. The increased temperature differential increases the efficiency of the thermoelectric power generation. The thermoelectric power output can be used to power field process devices or field process data concentrators directly without the use of either voltage multipliers or batteries. Field process devices are thus locally energized by the thermoelectric generator, and power wiring from a central control room is not needed. The thermoelectric power is adequate to energize wireless communication between the field device and the control room, and the need for communication wiring between a field device and the control room is eliminated.

The embodiments described below can also be used with process fluids that are colder than the environment, with the heat pipe functioning as a "cold pipe."

Figure 1:
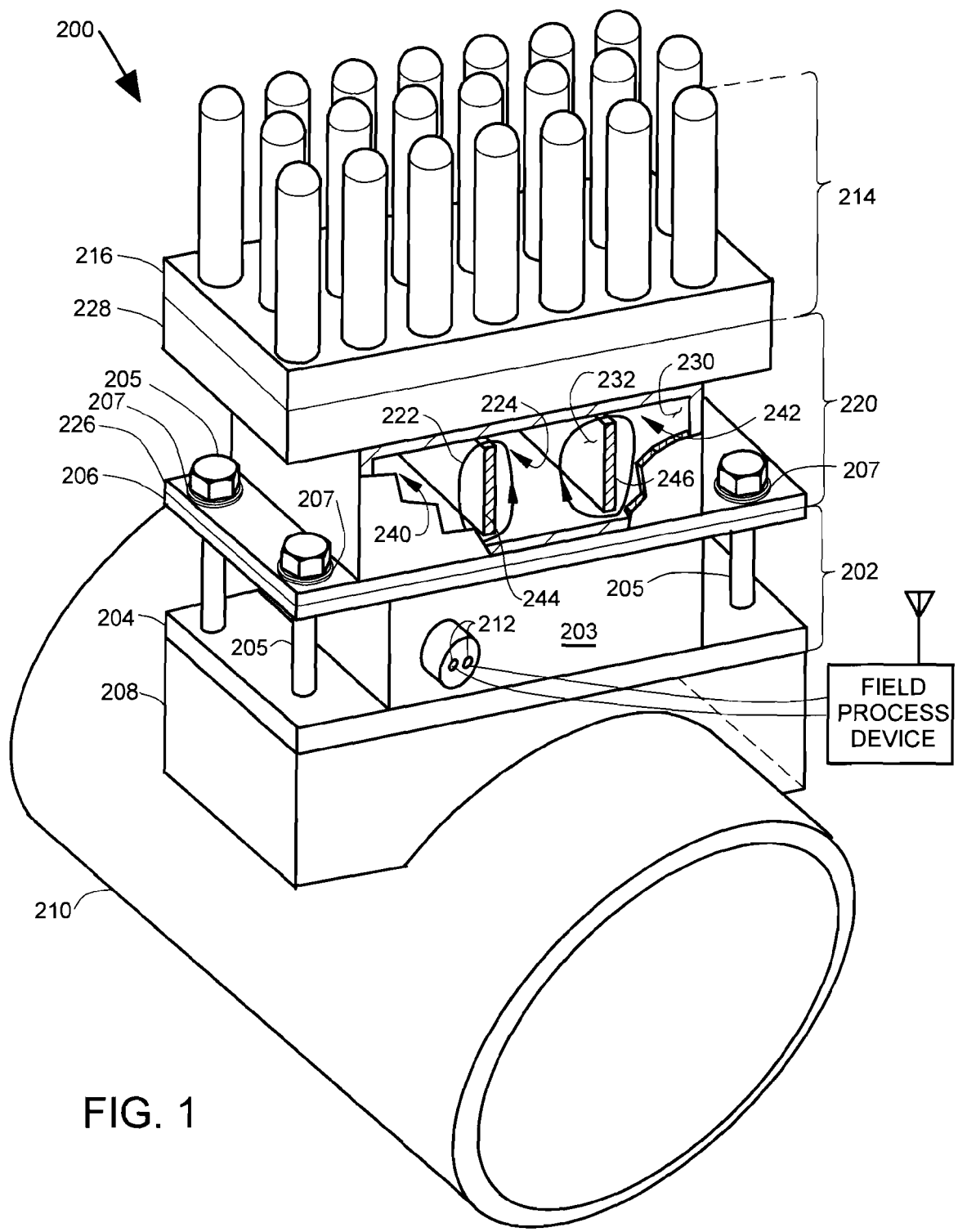
FIG. 1 illustrates a thermoelectric generator assembly that includes a heat pipe.

FIG. 1 illustrates a thermoelectric generator assembly 200. The thermoelectric generator assembly 200 comprises a thermoelectric generator 202. The thermoelectric generator 202 has a hot junction flange (hot side) 204 and a cold junction flange 206. (cold side) The flanges 204, 206 are spaced apart from one another. The hot junction flange 204 couples to (or includes) an adapter 208 that is shaped for thermally coupling to a process vessel 210. The process vessel 210 carries heated process fluid and provides a source of waste heat for the thermoelectric generator assembly 200. The thermoelectric generator 202 produces a thermoelectric power output 212 at a voltage level V. The thermoelectric generator comprises a thermoelement 203. In one embodiment, the thermoelectric element 203 comprises a semiconductor material. The thermoelectric element 203 can comprise elements Si, Ge, Bi, Sb, Te, for example, which are semiconducting. In another embodiment, the thermoelectric element 203 comprises chalcogenides to provide a high figure of merit. In one embodiment, the hot and cold junction flanges 204, 206 are arranged as enlarged flat plates that are larger than the thermoelectric element 203 and that overhang the thermoelectric element 203. The overhanging flanges 204, 206 provide large thermal transfer surfaces with high thermal conductivity. The overhanging flanges 204, 206 also include through holes for mounting bolts 205. In one embodiment, the bolts 205 are formed of stainless steel alloy with high thermal resistance and are mounted with thermally insulating washers 207, and the bolts 205 and washers 207 limit undesired heat flow through the bolts. The bolts 205 securely assemble the thermoelectric generator 202 to process adapter 208 and to heat pipe assembly 220.

The thermoelectric generator assembly 200 comprises a heat sink 214. The heat sink 214 thermally couples to ambient air and has a heat sink flange 216. The heat sink flange 216 is fastened by bolts (not illustrated) to an evaporator plate 228 of the heat pipe assembly 220. In one embodiment, the heat sink 214 comprises multiple pins (as illustrated) or multiple fins for large thermal radiation coupling to the ambient air.

The thermoelectric generator assembly 200 comprises the heat pipe assembly 220. The heat pipe assembly 220 comprises a fluid 222 in a circulation chamber 224. The heat pipe assembly 220 has an evaporator flange 226 mounted to the cold junction flange 206. The heat pipe assembly 220 has a condenser flange 228 mounted to the heat sink flange 216. At least a portion of the fluid 222 flows and transports heat from the evaporator flange 226 to the condenser flange 228. The heat pipe assembly 220 is described in more detail below in connection with an example illustrated in FIG. 3. As illustrated in FIG. 1, the heat pipe assembly 220 comprises a rectangular box shape and further comprises a first circulation wall 244 and a second circulation wall 246 that extend inside the rectangular box shape toward the overhanging evaporator flange 226 and the overhanging condenser flange 228. As illustrated in FIG. 1, the first and second circulation walls 244, 246 are spaced apart from one another to define a central upward flow chamber 232 between inner sides of the first and second circulation walls 244, 246 and to define first and second peripheral downward flow chambers 240, 242 peripheral to outer sides of the first and second circulation walls 244, 246.

Interposing the heat pipe assembly 220 between the cold junction flange 206 and the heat sink 214 increases delta T. Large Delta T is explained in more detail below in connection with a graph in FIG. 2. In one embodiment, delta T is enhanced by 25% when the hot junction flange 204 is in a hot junction temperature range over 100 degrees centigrade. In another embodiment, interposing the heat pipe assembly 220 between the cold junction flange 206 and the heat sink 214 maintains a delta T of at least 50 degrees centigrade when the hot junction flange 204 is in a hot junction temperature range over 100 degrees centigrade. In one embodiment, the voltage level V at thermoelectric power output 212 is at least 6 volts when the hot junction flange 204 is in a hot junction temperature range over 100 degrees centigrade. In yet another embodiment, the thermoelectric power output 212 is at least 150 milliwatts when the hot junction flange 204 is in a hot junction temperature range over 100 degrees centigrade. Thermoelectric power and voltage are generally directly proportional to a temperature difference between a hot junction flange 206 and a cold junction flange 204 of the thermoelectric module 203.

In one embodiment, the fluid 224 has a composition that is adapted to a hot junction temperature range between 50 degrees centigrade and 105 degrees centigrade. In another embodiment the fluid 224 comprises a mixture of alcohol and water with a ratio of alcohol to water that is optimized for the temperatures of the application. In another embodiment, the fluid 224 comprises a mixture of pressurized gas, alcohol, water or other heat conducting fluid in proportions to optimize performance for a temperature range in a particular application.

In one embodiment, the circulation chamber 224 comprises an interior chamber surface 230 that is a porous surface. In another embodiment, the circulation chamber 224 comprises an interior chamber 224 that includes capillaries. The circulation chamber 224 preferably comprises a central tube or channel 232 with a bore that is aligned vertically over the evaporator flange 226.

Figure 2:
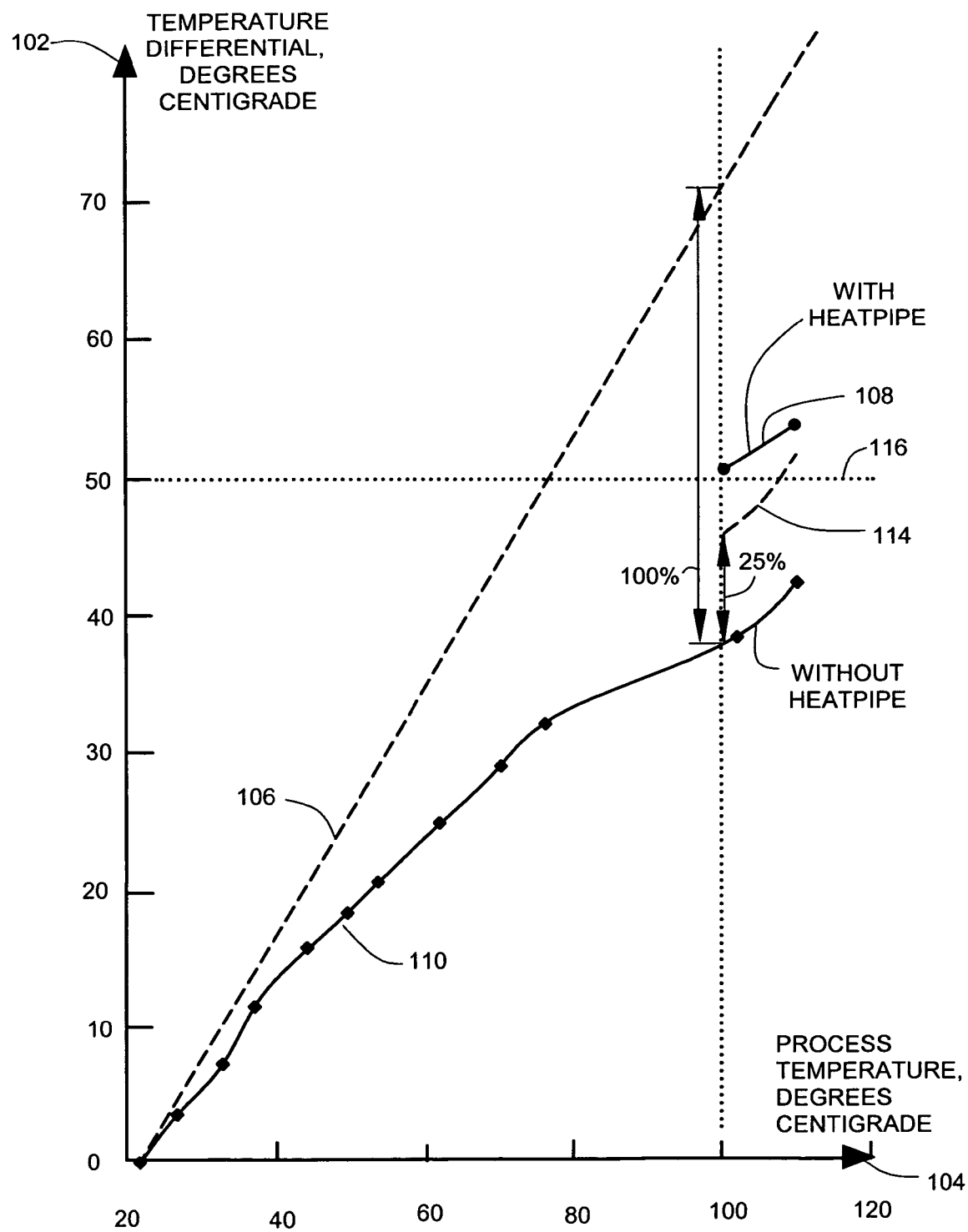
FIG. 2 illustrates a graph of temperature differentials associated with one thermoelectric generator that includes a heat pipe, and a comparable thermoelectric generator that does not include a heat pipe.

FIG. 2 illustrates a graph of temperature differentials associated with two different configurations of thermoelectric generators. One configuration includes a heat pipe, and the other configuration does not include a heat pipe.

A horizontal axis 104 represents a temperature T HOT, in degrees centigrade, of a hot junction flange (such as hot junction flange 204 described above in connection with FIG. 1). A vertical axis 102 represents temperature differences between hot and cold junctions on a thermoelectric module. A dashed line 106 represents a temperature differential DELTA T TOTAL between the free ambient air temperature and the hot junction flange temperature. This dashed line 106 represents a maximum available temperature difference available to the thermoelectric generator assemblies. In practice, there is high thermal conductance between the hot junction flange and the process vessel such that the hot junction temperature is very close to the process vessel temperature.

Due to the thermal conductance of the thermoelectric generator, heat is conducted from the hot junction flange to the cold junction flange. The conducted heat raises the temperature of the cold junction flange, which reduces the temperature differential available for thermoelectric power generation. There is a loss of temperature differential because of heating of the cold junction flange. Only a percentage of the DELTA T TOTAL (dashed line 106) is actually present between the hot junction flange and the cold junction flange.

A solid line 108 with circle (●) end points represents a temperature differential DELTA T WITH HEAT PIPE between hot and cold junction flanges 204, 206 of the thermoelectric generator 202 in FIG. 1. The thermoelectric generator 202 (represented by solid line 108) includes the heat pipe 220 (FIG. 1).

A solid line 110 with diamond (♦) data points represents a temperature differential DELTA T NO HEAT PIPE between hot and cold flanges of a thermoelectric generator that does not include a heat pipe. The thermoelectric generator represented by solid line 110 is similar to the thermoelectric generator 200 described above in connection with FIG. 1, however, the heat pipe 220 is absent and the heat sink 214 is coupled directly to the cold junction flange 206 for the solid line 110. Solid line 110 represents DELTA T without the use of a heat pipe. It can be seen from inspection of FIG. 2 that a larger temperature differential is maintained with the use of the heat pipe 220. The heat pipe 220 reduces the temperature of the cold junction flange 206 and increases the temperature differential. A vertical distance between the dashed line 106 and a solid line represents a loss of maximum temperature differential due to heating of the cold junction flange. The loss of maximum temperature differential is smaller when the heat pipe 220 is used.

In FIG. 2, dashed line 114 represents 25% of a loss of temperature differential (indicated as 100% in FIG. 2) between lines 110 and 106 at 100 degrees and above. In FIG. 2, dotted line 116 represents a 50 degree centigrade temperature differential. Line 108, which represents temperature differential with the use of a heat pipe (as shown in FIG. 1) lies in a location that is above dotted line 116 and also above dashed line 114 at 100 degrees centigrade and above. The graph illustrates that, for process temperatures above 100 degrees centigrade, the thermoelectric generator 200 with a heat pipe maintains a DELTA T loss that is at least 25% improved in comparison with line 110. The graph also illustrates that, for process temperatures above 100 degrees centigrade, the thermoelectric generator with a heat pipe maintains a DELTA T of at least 50 degrees centigrade. With these improved DELTA T values achieved by the use of a heat pipe, the thermoelectric generator produces a thermoelectric output of at least 150 milliwatts at a voltage that is at least 6 volts. The voltage is high enough so that the thermoelectric output can be connected to energize a field process device (such as a pressure transmitter) that includes nominal 5 volt electronic circuits without the use of a voltage multiplier circuit for boosting a lower thermoelectric voltage up to a level above the 5 volts. The power output is high enough and reliable enough so that the thermoelectric generator can be connected to energize one or more field process devices with up to 150 milliwatts of power without the use of batteries. With the use of heat pipes on thermoelectric generators, power supplies in field devices can be free of both batteries and voltage multiplier circuits. The amount of power available from the thermoelectric device is also sufficient to energize a wireless communication circuit in the field process device. Wireless transmitters can be energized by the thermoelectric generator. Alternatively, the thermoelectric generator can be used to energize a wireless field data concentrator which provides wireless transmission of process data from field transmitters to a control system at a remote location.

Figure 3:
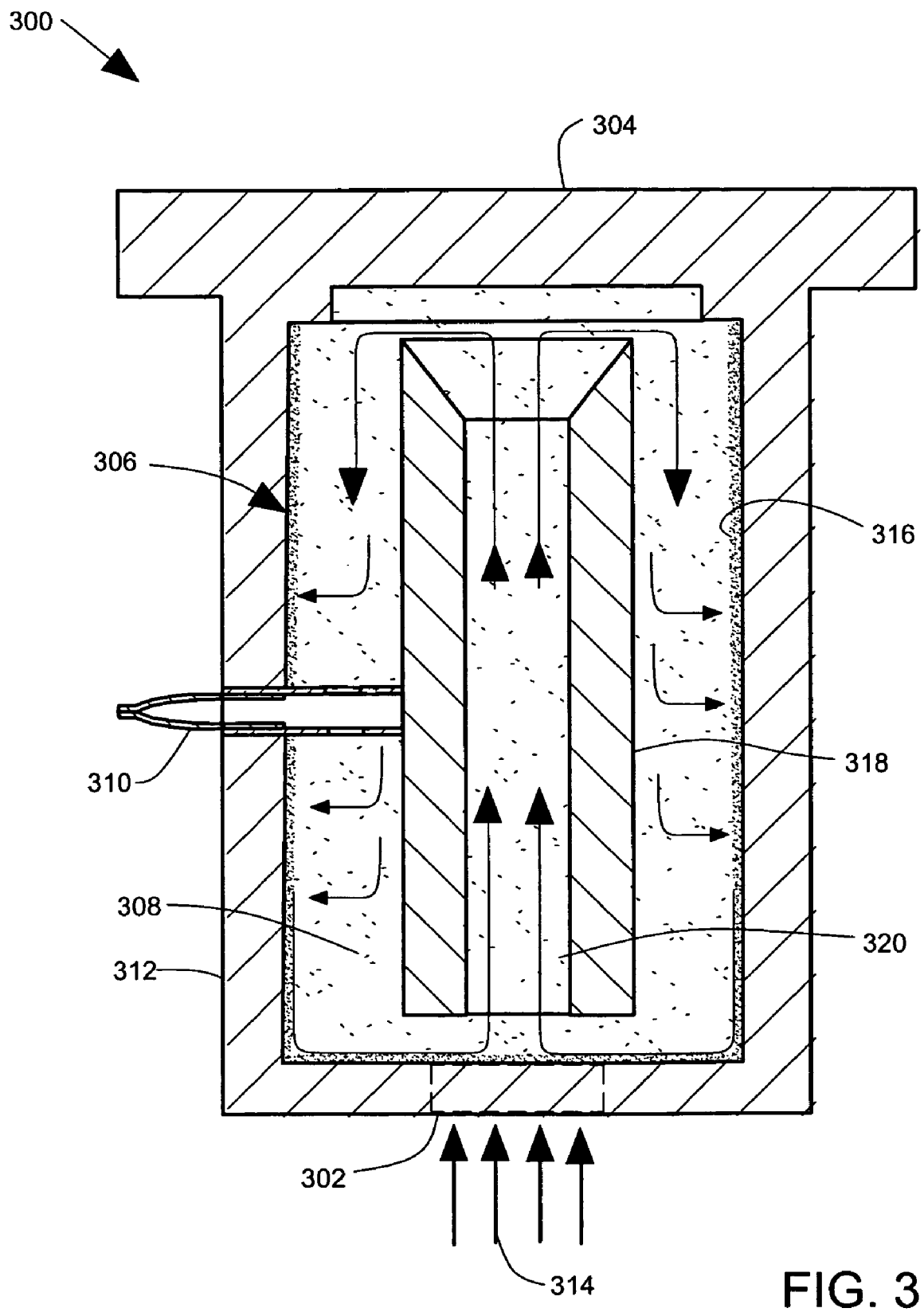
FIG. 3 illustrates an embodiment of a heat pipe.

FIG. 3 illustrates an embodiment of a heat pipe 300. Heat pipe 300 comprises an evaporator flange 302, a condenser flange 304 and a fluid circulation chamber 306. A fluid 308 is introduced into the circulation chamber 306 by way of a fill tube 310 in a peripheral wall 312. The circulation chamber 306 is preferably evacuated before introduction of the fluid 308. After introduction of a controlled amount (charge) of the fluid 308, the fill tube 310 is sealed. Under the operating conditions of pressure and temperature in the fluid circulation chamber 306, the fluid 308 (or a component of the fluid 308) evaporates at the evaporator flange 302 to cool the evaporator flange 302. Heat 314 (from a hot junction flange such as hot junction flange 206 in FIG. 1) is applied to the evaporator flange 302 to evaporate the fluid. The fluid 308 (or a component of the fluid 308) condenses at the condenser flange 304 or on the interior surface of the peripheral wall 312. The condenser flange 304 is cooled by a heat sink (such as heat sink 214 in FIG. 1) to condense the fluid 308.

The composition of the fill fluid 308 and the amount of the fill fluid 308 are selected to optimize heat transfer in a particular process temperature range. Any known fluid suitable for the operating temperature can be used for fluid 308. In one embodiment, fluid 308 comprises a mixture of alcohol and water. The interior walls of the circulation chamber 306 are preferably coated with a porous or sintered layer 316 of metal that facilitates condensation and flow of liquid fluid 308 back to the evaporator flange 302. Alternatively, capillary tubes can be provided in the circulation chamber 306 in place of the sintered layer 316.

A central pipe 318 is supported in the circulation chamber 306. The central pipe 318 has a bore 320 that is generally vertically aligned with the applied heat 314 so that vaporized fluid 308 flows upwardly in the bore 320. The bore 320 is open at both the top and the bottom. A generally toroidal fluid flow pattern is established as illustrated, providing mass transfer that carries heat upwardly from the evaporator flange 302, through the bore 320, to the condenser flange 304. As illustrated, the heat pipe 300 can have condensing surfaces at condensing flange 304 and peripheral wall 312 that have a combined surface area that is much larger than the evaporator flange 302. A large amount of heat can be transferred, and the cold junction flange (such as cold junction flange 206 in FIG. 1) operates closer to ambient temperature than it would if it were coupled directly to a heat sink. Using a heat pipe, a large DELTA T can be maintained across the thermoelectric generator (such as thermoelectric generator 202 in FIG. 1), resulting in high thermoelectric power generation at a relatively high voltage. The heat flow 314 from the cold junction flange tends to be concentrated near a central region as illustrated in FIG. 3 due to the buildup of heat in a central core region of the thermoelectric element.

Figure 4:
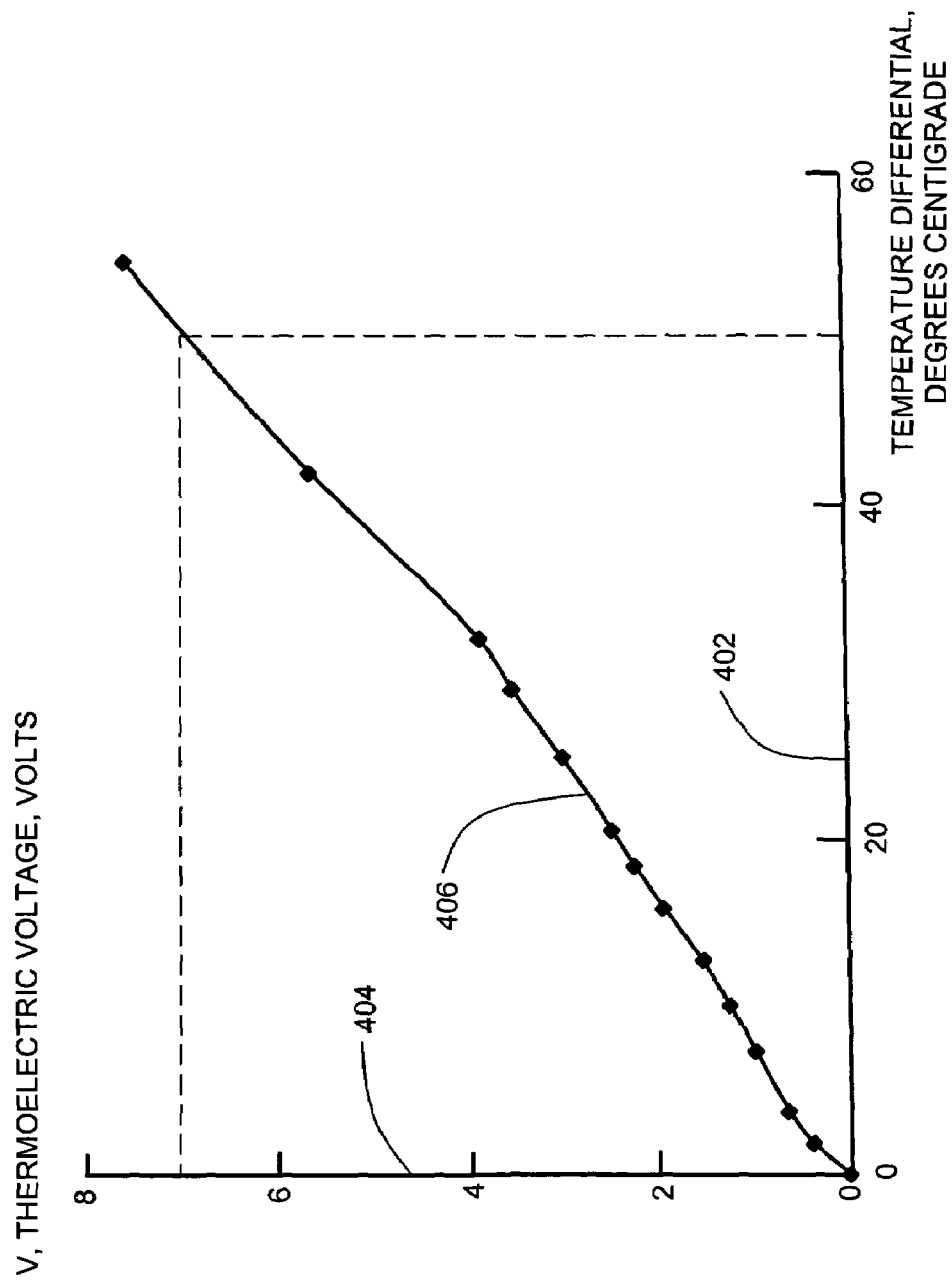
FIG. 4 illustrates a graph of voltage at a thermoelectric output as a function of temperature differential between hot and cold junction flanges of a thermoelectric generator.

FIG. 4 illustrates a graph of voltage V at a thermoelectric output as a function of temperature differential between hot and cold junction flanges of a thermoelectric generator. A horizontal axis 402 represents a temperature differential DELTA T in degrees centigrade. A vertical axis 404 represents voltage V at a thermoelectric output. A solid line 406 represents the voltage V as a function of temperature differential. As illustrated in FIG. 4, the voltage V is highly sensitive to temperature differential. Maintaining a large temperature differential through the use of a heat pipe increases the voltage V to a level where it can be used to energize 5 volt electronics in a field transmitter without the use of a voltage multiplier circuit. As illustrated in FIG. 4, a temperature differential of 50 degrees can provide a voltage V that is larger than 6 volts and able to energize a 5 volt power supply in a field device without the use of a voltage multiplier.

Figure 5:
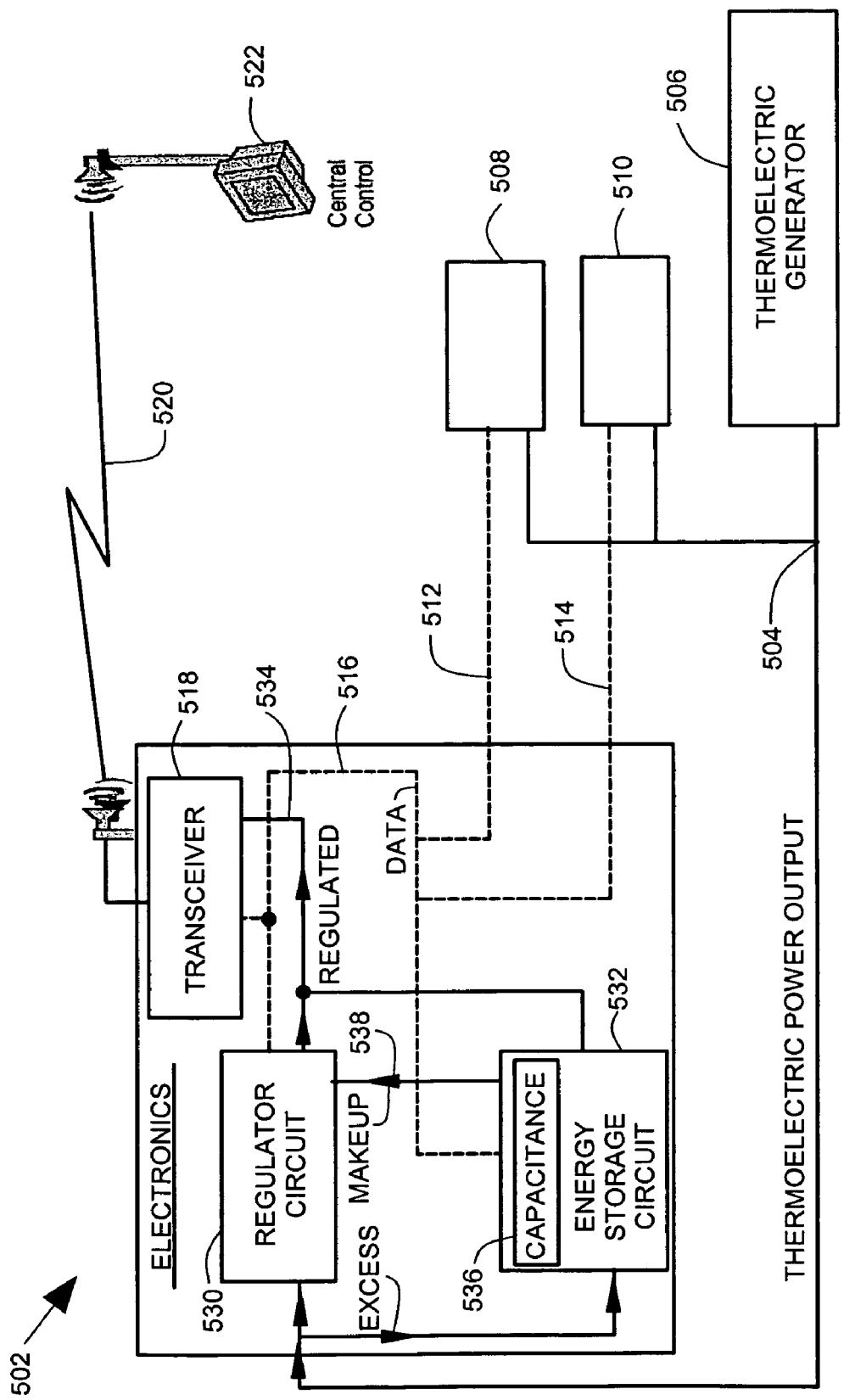
FIG. 5 illustrates a field data concentrator coupled to a thermoelectric output of a thermoelectric generator.

FIG. 5 illustrates a field data concentrator 502 coupled to a thermoelectric output 504 of a thermoelectric generator 506 (such as thermoelectric generator 200 in FIG. 1). Field process devices 508, 510, which can be field process sensors or field process actuators, are energized by the thermoelectric output 504. Field process devices 508, 510 include 5 volt electronic circuitry that is energized by the thermoelectric output 504. Thermoelectric generator 506 energizes the field process devices 508, 510, which do not require inefficient voltage multipliers because the thermoelectric output is greater than 5 volts. The energization of the field process devices 508, 510 can come directly from the thermoelectric output 504, as illustrated, or can be indirectly derived from the field data concentrator 502. The field process devices 508, 510 exchange data along lines 512, 514 with the field data concentrator 502. The lines 512, 514 can be any know type of communication link such as wires, wireless or optical. The lines 512, 514 can also carry thermoelectric power to the field process devices 508, 510.

The data is exchanged along data bus 516 with wireless transceiver 518. Wireless transceiver 518 communicates the data over a wireless link 520 with a control system 522 that is at a location that is remote from the field environment.

The field data concentrator 502 includes a regulator circuit 530 and an energy storage circuit 532 that receive the thermoelectric power output 504. The regulator circuit 530 provides energization to circuitry in the field data concentrator 520 along a regulated power bus 534. The regulator circuit 530 does not include a voltage multiplier circuit and is able to provide a regulated voltage output at 5 volts. The energy storage circuit 532 includes a storage capacitance 536 that stores excess energy available from the thermoelectric power output 504. When the energy storage circuit senses that inadequate power is available at the regulated power bus 534, the energy storage circuit 532 couples makeup energy along line 538 to the regulator circuit 530.

It will be understood by those skilled in the art that the temperature differential can be reversed in the case of process fluids that are cooled below ambient temperature, instead of heated above ambient temperature, and that the embodiments described herein are equally useful with such cold process fluids. Use of the embodiments described herein with cooled process fluids is also contemplated.

A heat pipe can be mounted between the cold junction flange and the heat sink, enhancing efficiency of heat transfer from the thermoelectric module to the environment. This, in turn, enhances the temperature gradient across the thermoelectric module. As a result, the power generation by the thermoelectric generator, using the same process heat, is much higher in comparison to use of a conventional heat sink. In cases where the process fluid is colder than the environment, heat pipes can also be used as "cold pipes". Embodiments shown can be used to power sensors and transducers in remote locations for industrial as well as domestic applications.

Although the present invention has been described with reference to preferred embodiments, workers skilled in the art will recognize that changes may be made in form and detail without departing from the spirit and scope of the invention.

What is claimed is:

1. A thermoelectric generator assembly, comprising:
a thermoelectric generator having a thermoelectric element and spaced-apart hot and cold junction flanges that comprise flat plates that overhang the thermoelectric element, the hot junction flange having an adapter shaped for thermally coupling to a process vessel;
a heat sink thermally coupled to ambient air and having a heat sink flange; and
a heat pipe assembly comprising a fluid in a circulation chamber, the circulation chamber having a rectangular box shape, an overhanging evaporator flange mounted to the cold junction flange, and an overhanging condenser flange mounted to the heat sink flange, at least a portion of the fluid transporting heat from the overhanging evaporator flange to the overhanging condenser flange, the heat pipe assembly further comprising first and second circulation walls that extend inside the rectangular box shape toward the overhanging evaporator flange and the overhanging condenser flange, the first and second circulation walls being spaced apart from one another to define a central upward flow chamber between inner sides of the first and second circulation walls and to define first and second peripheral downward flow chambers peripheral to outer sides of the first and second circulation walls.

2. The thermoelectric generator assembly of claim 1 wherein interposing of the heat pipe assembly between the cold junction flange and the heat sink increases efficiency and maintains a delta T of at least 50 degrees centigrade in a hot junction temperature range around 100 degrees centigrade.

3. The thermoelectric generator assembly of claim 1 wherein interposing of the heat pipe assembly between the cold junction flange and the heat sink enhances delta T by at least 25% in a hot junction temperature range around 100 degrees centigrade.

4. The thermoelectric generator assembly of claim 1 wherein the thermoelectric element generates a voltage level that is at least 6 volts in a hot junction temperature range around 100 degrees centigrade.

5. The thermoelectric generator assembly of claim 1 wherein the thermoelectric element generates a thermoelectric power output that is at least 150 milliwatts in a hot junction temperature range around 100 degrees centigrade.

6. The thermoelectric generator assembly of claim 1 wherein the fluid has a composition that is adapted to a hot junction temperature range between 50 degrees centigrade and 105 degrees centigrade.

7. The thermoelectric generator assembly of claim 1 wherein the fluid comprises a mixture of alcohol, water, pressurized gas or other heat conducting fluid.

8. The thermoelectric generator assembly of claim 1 wherein the circulation chamber comprises an interior chamber surface that is a porous surface.

9. The thermoelectric generator assembly of claim 1 wherein the circulation chamber comprises an interior chamber that includes capillaries.

10. The thermoelectric generator assembly of claim 1 wherein the circulation chamber comprises a central upward flow chamber aligned vertically over the overhanging evaporator flange.

11. The thermoelectric generator assembly of claim 1 wherein the thermoelectric generator provides power to process devices and sensors in remote industrial/domestic locations.

12. The thermoelectric generator assembly of claim 1 and comprising a field process transmitter receiving the thermoelectric power output.

13. The thermoelectric generator assembly of claim 12 wherein the field process transmitter comprises a wireless transmitter.

14. The thermoelectric generator assembly of claim 1 and comprising a wireless transceiver receiving the thermoelectric power output.

15. The thermoelectric generator assembly of claim 1 wherein the thermoelectric element is formed of a semiconductor materials comprising Si, Ge or alloys thereof.

16. The thermoelectric generator assembly of claim 14 wherein the thermoelectric element is formed of semiconductor materials that comprise chalcogenides of Bi, Sb, Te, Se or alloys thereof.

17. The thermoelectric generator assembly of claim 1 wherein the thermoelectric generator is adapted for corrosive environments up to 450 degrees centigrade.

18. The thermoelectric generator assembly of claim 1 and further comprising a field instrument that is powered by the thermoelectric power output, the field instrument being free of a battery.

19. The thermoelectric generator assembly of claim 1 and further comprising a field instrument that is powered by the thermoelectric element, the field instrument being free of a voltage multiplier circuit for generating potential differences larger than the voltage level.

20. A thermoelectric generator assembly, comprising:

a thermoelectric generator having a thermoelectric element and spaced-apart hot and cold junction flanges that comprise flat plates that overhang the thermoelectric element, the hot junction flange including a shape that is thermally couplable to a process vessel shape;

a heat sink thermally coupled to ambient air and having a heat sink flange; and heat pipe means for evaporating a fluid in a circulation chamber that is evacuated except for the fluid to transport heat from the cold junction flange to the heat sink flange, the heat pipe means having a rectangular box shape and further comprising first and second circulation walls that extend inside the rectangular box shape toward an overhanging evaporator flange and an overhanging condenser flange, the first and second circulation walls being spaced apart from one another to define a central upward flow chamber between inner sides of the first and second circulation walls and to define first and second peripheral downward flow chambers peripheral to outer sides of the first and second circulation walls.

21. The thermoelectric generator assembly of claim 20 wherein the heat pipe means comprises a peripheral wall.

22. The thermoelectric generator assembly of claim 20 wherein the thermoelectric element provides a thermoelectric power output that is at least 6 volts.

23. A method of providing a thermoelectric power output, comprising:

shaping a hot junction flange adapter to couple to a process vessel shape;

providing a thermoelectric generator having a thermoelectric element and spaced-apart hot and cold junction flanges that comprise flat plates that overhang the thermoelectric element;

thermally coupling the hot junction flange to the hot junction flange adapter;

providing a heat sink with a heat sink flange coupled to the cold junction flange;

mounting a heat pipe assembly to the heat sink;

providing the heat pipe assembly with an evacuated circulation chamber surrounded by a peripheral wall; and providing the heat pipe assembly with a rectangular box shape and further providing first and second circulation walls that extend inside the rectangular box shape toward an overhanging evaporator flange and an overhanging condenser flange, the first and second circulation walls being spaced apart from one another to define a central upward flow chamber between inner sides of the first and second circulation walls and to define first and second peripheral downward flow chambers peripheral to outer sides of the first and second circulation walls.

24. The method of claim 23 and shaping the heat sink to include multiple pins for thermal radiation to the ambient air.

25. The method of claim 23 wherein the thermoelectric element provides a thermoelectric power output that is at least 6 volts.

* * * * *